United States Patent [19]

Koike

[11] Patent Number: 5,446,454
[45] Date of Patent: Aug. 29, 1995

[54] ARRANGEMENT OF DETECTING CURRENT REVISION LEVELS OF A PLURALITY OF PLUG-IN BOARDS

[75] Inventor: Takeshi Koike, Tokyo, Japan
[73] Assignee: NEC Corporation, Tokyo, Japan
[21] Appl. No.: 945,209
[22] Filed: Sep. 9, 1992

[30] Foreign Application Priority Data

Sep. 9, 1991 [JP] Japan .................................. 3-228964

[51] Int. Cl.$^6$ ............................................. H04Q 1/00
[52] U.S. Cl. .................................. 340/825.52; 364/550
[58] Field of Search ..................... 340/825.52, 825.31, 340/825.34; 364/550

[56] References Cited

U.S. PATENT DOCUMENTS

| 4,799,635 | 1/1989 | Nakagawa | 340/825.31 |
| 5,134,391 | 7/1992 | Okada | 340/825.31 |
| 5,239,485 | 8/1993 | Ohba | 364/550 |

OTHER PUBLICATIONS

"*Understanding Data Communication*". Friend, George et al. 1984 pp. 2-18.

Primary Examiner—Donald J. Yusko
Assistant Examiner—Brian Zimmerman
Attorney, Agent, or Firm—Foley & Lardner

[57] ABSTRACT

In order to ascertain the current revision levels of a plurality of plug-in boards which have been inserted into a digital data processing system, a plurality of number generators are respectively mounted on the plug-in boards. Each of the number generators retains the current revision level of the corresponding plug-in board, and produces current revision level data. A display is operatively coupled to the number generators and receives the revision level data therefrom and exhibits the current revision levels of the plug-in boards. Further, each of the revision levels is checked to see if it is confined within a range of revision levels which are available for the data processing system. The check results are also exhibited on the display. Still further, in the event that: (a) a given revision level is detected outside the revision level range and (b) the plug-in board is found dispensable, the board is logically disconnected from the data processing system. In this case, the system starts operations while the board is physically inserted into the system but logically disconnected therefrom.

5 Claims, 6 Drawing Sheets

FIG. 5

| PLUG-IN BOARD NO. | CURRENT REVISION LEVEL |
|---|---|
| 10a | 7 (="00000111") |
| ⋮ | ⋮ |
| 10n | 13 (="00001101") |

FIG. 6

| PLUG-IN BOARD NO. | RANGE OF ALLOWABLE REVISION LEVELS |
|---|---|
| 10a | 1 - 10 |
| ⋮ | ⋮ |
| 10n | 2 - 11 |

FIG. 7

| PLUG-IN BOARD NO. | BIT INDICATIVE OF DISPENSABILITY |
|---|---|
| 10a | 0 (=NO) |
| ⋮ | ⋮ |
| 10n | 1 (=YES) |

FIG. 8

| PLUG-IN BOARD NO. | CURRENT REVISION LEVEL |
|---|---|
| 10a | 7 |
| ⋮ | ⋮ |
| 10n | 13 |

FIG. 9

| PLUG-IN BOARD NO. | CURRENT REVISION LEVEL | AVAILABILITY |
|---|---|---|
| 10a | 7 | YES |
| ⋮ | ⋮ | ⋮ |
| 10n | 13 | NO |

FIG. 10

| PLUG-IN BOARD NO. | CURRENT REVISION LEVEL | AVAILABILITY | BIT INDICATIVE OF DISPENSABILITY | CONNECTION |
|---|---|---|---|---|
| 10a | 7 | YES | 0 (=NO) | YES |
| ⋮ | ⋮ | ⋮ | ⋮ | ⋮ |
| 10n | 13 | NO | 1 (=YES) | NO |

ARRANGEMENT OF DETECTING CURRENT REVISION LEVELS OF A PLURALITY OF PLUG-IN BOARDS

BACKGROUND OF THE INVENTION

1. Field of the Invention

The present invention relates to an arrangement of determining a latest revision level of each of a plurality of plug-in boards, and more specifically to such an arrangement wherein a latest revision level of each plug-in board is manually set using a number generator mounted on the board. Further, the present invention relates to an arrangement of determining whether or not a current revision level of each of a plurality of plug-in boards is confined within an allowable revision level range.

2. Description of the Prior Art

A digital data processing system, such as a computer, is normally provided with a passive receptacle or sockets into which edge connectors of a plurality of plug-in boards are inserted. Such a passive receptacle is sometimes called a backplane. The plug-in boards are I/O (Input/Output) boards, CPU (Central Processing Unit) boards, Memory boards, etc.

Plug-in boards are independently subject to revisions to improve performance, lower cost, etc. It follows that the revision levels of the boards actually plugged into the backplane of the system may differ with different plug-in boards. Consequently, it is necessary for a person in charge of maintenance (for example) of the system to know which revision level is available for the system in terms of each of the boards to be inserted. To this end, it is vital for the person to have a complete list of revision levels of the plug-in boards which are available.

One known approach to recording the current revision level on a board, is to stamp the current revision level mark on the board. However, it is often the case that the stamped revision level mark is difficult to be visible from the outside when inserted into the system structure due to components mounted on adjacent boards. Accordingly, it is required to pull out the board from the receptacles for ascertaining the stamped revision level. Further, when one or more components of a board are replaced and revised, the old stamped mark is awkwardly erased and a new revision level should be stamped.

Another known approach to determining the revision levels of the boards is to provide each plug-in board with a ROM (read only memory) into which the current revision level of the board is written each time the board is This approach is advantageous in that the revision levels of the plug-in boards can be monitored by a service processor using a display thereof. However, even if one component is revised, it is necessary to rewrite the contents of the ROM. Further, the revision level is electrically recorded in the ROM and thus it is undesirably impossible to visually perceive the revision level from the outside.

SUMMARY OF THE INVENTION

It is an object of the present invention to provide an arrangement which utilizes a plurality of revision number generators respectively mounted on a plurality of plug-in boards and which features that the current revision level having been set by the number generators can visually be ascertained and also can be exhibited on a display.

Another object of the present invention is to provide an arrangement wherein each of the revision levels of the plug-in boards is checked to see if it is confined within a range of revision levels which are available for the data processing system and wherein the check results are also exhibited on the display.

Still another object of the present invention is to provide an arrangement wherein in the event that a given revision level is detected outside the range of allowable revision levels range and also the plug-in board is found dispensable, the board is logically disconnected from the data processing system.

These objects are fulfilled by an arrangement wherein in order to ascertain the current revision levels of a plurality of plug-in boards which have been inserted into a digital data processing system, a plurality of number generators are respectively mounted on the plug-in boards. Each of the number generators retains the current revision level of the corresponding plug-in board, and produces current revision level data. A display is operatively coupled to the number generators and receives the revision level data therefrom and exhibits the current revision levels of the plug-in boards. Further, each of the revision levels is checked to see if it is confined within a range of revision levels which are available for the data processing system. The check results are also exhibited on the display. Still further, in the event that: (a) a given revision level is detected outside the revision level range and (b) the plug-in board is found dispensable, the board is logically disconnected from the data processing system. In this case, the system starts operations while the board is physically inserted into the system but logically disconnected therefrom.

An aspect of the present invention comes in an arrangement of ascertaining revision levels of a plurality of plug-in boards which have been inserted into a digital data processing system, comprising: a plurality of number generating means which are respectively mounted on the plurality of plug-in boards and which respectively retain the revision levels of the plurality of plug-in boards, each of the plurality of number generating means producing revision level data; and a display means which is operatively coupled to the plurality of number generating means and which receives the revision level data therefrom, the display means exhibiting the revision levels of the plurality of plug-in boards.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 5 is a list showing current revision levels which have been set in a manual switch unit mounted on a plug-in board;

FIG. 6 is a list of revision level ranges which are available for the digital data processing system and are stored in a memory provided in the system;

FIG. 7 is a list of data each indicating that a given plug-in board is dispensable to a data processing system to which the plug-in boards are coupled; and FIGS. 8-10 each illustrates a list displayed.

DETAILED DESCRIPTION OF THE PREFERRED EMBODIMENTS

Figure 1:
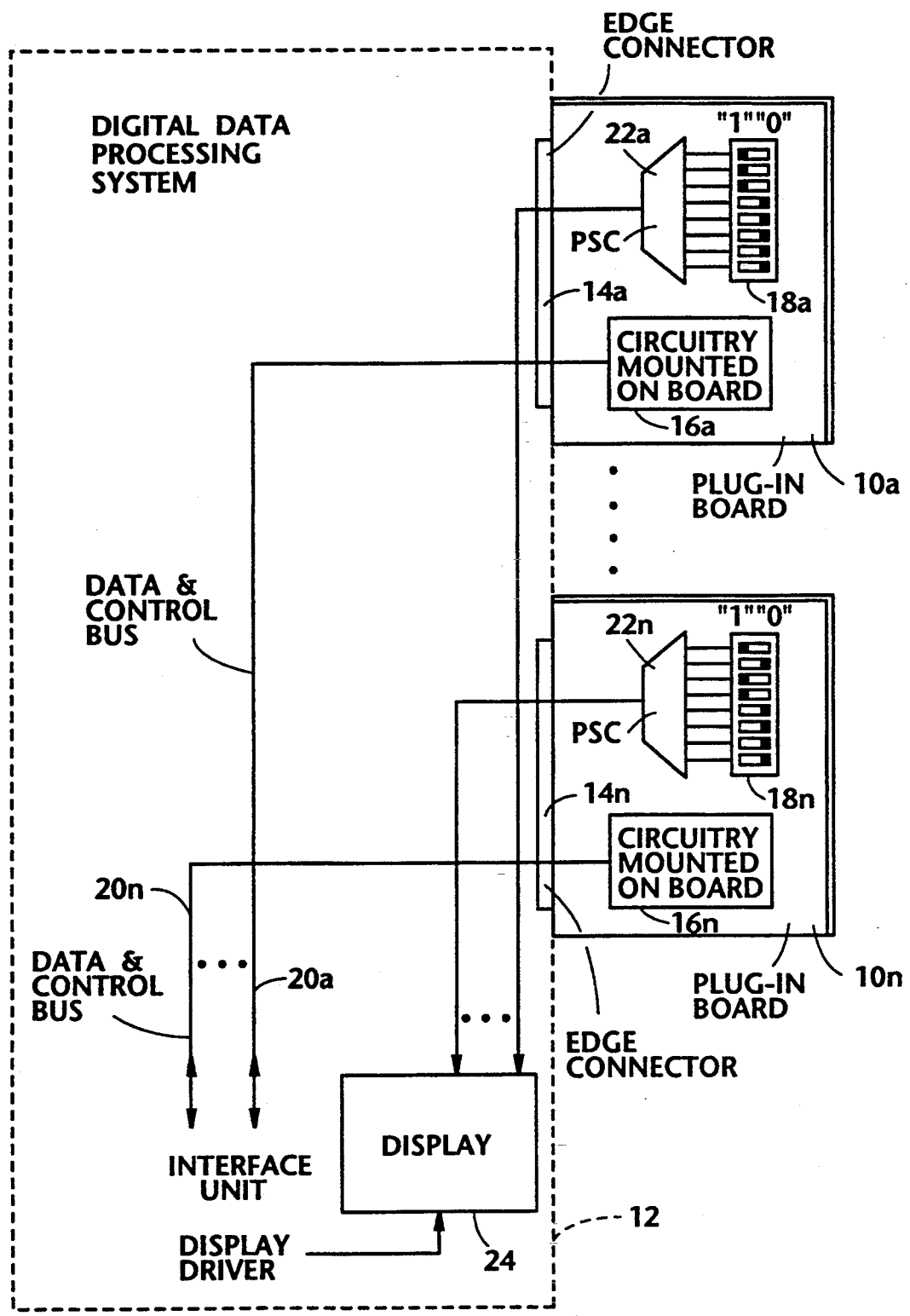
FIG. 1 is a block diagram schematically showing an arrangement of a first embodiment of the present invention.
Figure 2:
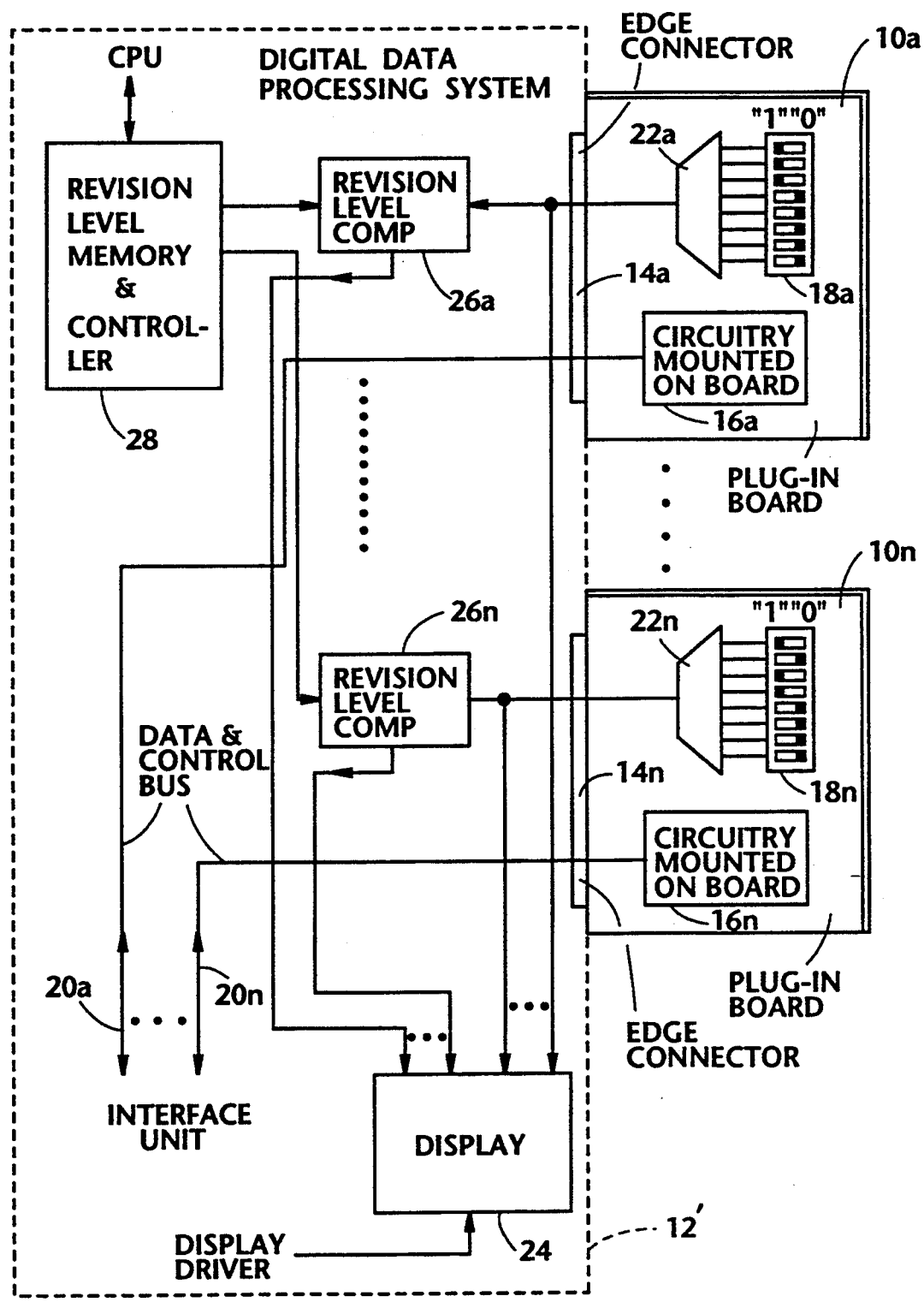
FIG. 2 is a block diagram schematically showing an arrangement of a second embodiment of the present invention.

A first embodiment of the present invention will be discussed with reference to FIGS. 1, 5 and 8.

A plurality of plug-in boards 10a-10n (only two are illustrated) are operatively coupled to a digital data processing system 12. In more specific terms, edge connectors 14a-14n of the plug-in boards 10a-10n are inserted into a passive receptacle (not shown) of the system 12. The digital data processing system 12 is conventional, the details of which are not important for an understanding of the present invention and hence are not shown merely for the sake of simplifying the drawing. As mentioned above, the plug-in boards are CPU boards, I/O boards, Memory boards, etc.

The plug-in boards 10a-10n are respectively provided with logic circuitry 16a-16n on either one or both sides thereof, and also respectively carry thereon number generators 18a-18n. Each of the number generators 18a-18n takes the form of a switch unit which has eight separate slide switches arranged in line and, accordingly is able to represent 256 numerical values each of which represents a revision level of the corresponding plug-in board. It should be noted that the number of the separate slide switches is not limited to eight.

The logic circuitry 16a-16n provided on the plug-in boards 10a-10n are coupled to an interface unit (not shown) of the system 12 via data/control buses 20a-20n, respectively. The logic circuitry is conventional and is not concerned with the present invention, and thus will not be described in detail hereinafter.

As shown in FIG. 1, the switch unit 18a, is set to "00000111" (viz., 7 in decimal) while the switch unit 18n, is set to "00001101" (viz., 13 in decimal) merely by way of example.

FIG. 5 is a list which depicts a relationship between the plug-in boards 10a-10n and the revision levels thereof which have been set at the corresponding numeral generators 18a-18n before the boards are inserted.

In FIG. 1, a parallel/serial converter (depicted by PSC) 22a receives the parallel outputs of the switch unit 18a and converts them into the corresponding serial data which is in turn applied to a display unit 24. Similarly, a parallel/serial converter 22n applies the serial output thereof to the display unit 24. The display unit 24 is controlled by a display driver (not shown) and exhibits the current revision levels of all the plug-in boards 10a-10n as schematically shown in FIG. 8.

The first embodiment realizes the following features. That is, the revision levels can be changed by manually changing one or more switch positions. Further, the revision levels can be ascertained or confirmed from the outside as in the case of the above-mentioned revision level mark stamped on the board. Still further, all the revision levels of the plug-in boards coupled to the system 12 can be exhibited on a display.

A second embodiment of the present invention will be described with reference to FIGS. 2, 3, 6 and 9.

The arrangement of the second embodiment differs from that of the first one in that a digital data processing system 12' of the former arrangement further includes a plurality of revision level comparators 26a-26n and a revision level memory & controller 28.

Figure 3:
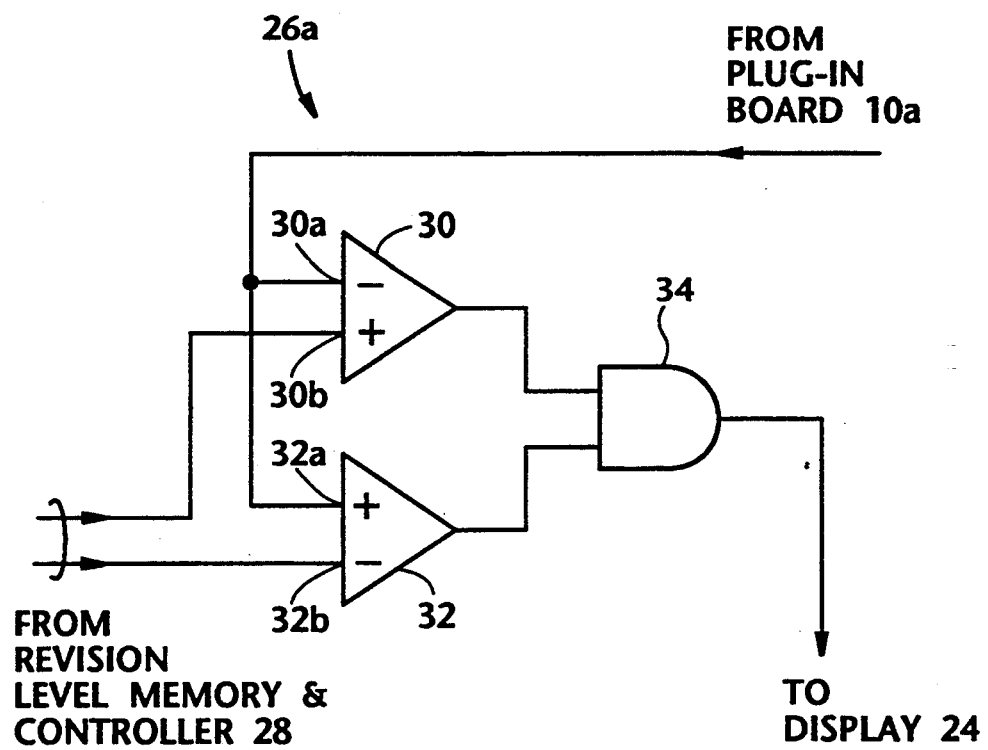
FIG. 3 is a block diagram showing in detail one block of FIG. 2.

FIG. 3 shows in detail an example of the comparator 26a. The other comparators 26b-26n (although only 26n is shown) are configured in exactly the same manner as the comparator 26a.

The memory & controller 28 is provided with a memory and a control sections (neither shown). The memory section stores a range of revision levels, which are acceptable to the system 12', in connection with each of the plug-in boards 10a-10n. The control section is used to control the operations of applying the contents of the memory section to the comparators 26a-26n, etc.

FIG. 6 is a list which shows a relationship between the plug-in boards 10a-10n and the ranges of revision levels which are allowable or acceptable to the system 12'.

If the revision level of a given board is detected as being not allowable, the availability of the given plug-in board is displayed as shown in FIG. 9.

The operations of the second embodiment will be discussed hereinlater. However, the portions which have been referred to in connection with the first embodiment will not be described in detail or omitted for brevity.

The plug-in board 10a applies, from the parallel/serial converter 22a, the revision level thereof to the comparator 26a. As illustrated in FIG. 3, the comparator 26a includes first and second comparators 30, 32 and an AND gate 34. The first comparator 30 receives, at an inverting input 30a thereof, the revision level "7" from the plug-in board 10a while receiving, at an non-inverting input 30b, the uppermost allowable revision level "10" (FIG. 6) from the block 28. In this instance, the first comparator 30 issues a logic "1" in that the uppermost allowable revision level is greater than the current revision level of the board 10a. On the other hand, the second comparator 32 is supplied with the revision level "7" from the plug-in board 10a at a non-inverting input 32a and also receives the lowermost allowable revision level "1" (FIG. 6) from the block 28 at an inverting input 32b thereof. In this case, the revision level of the board 10a is greater than the lowermost value and hence the second comparator 32 produces a logic "1". Thus, the AND gate 34 supplies the display 24 with a logic "1" which indicates that the board 10a is available for the system 12'.

Contrarily, the revision level "13" of the board 10n is not confined within the range of allowable revision level (viz., 2-11 (FIG. 6)). Accordingly, the revision level comparator 26n issues a logic "0" which is relayed to the display 24.

FIG. 9 shows a list which is exhibited on the display 24 and which indicates a relationship between the plug-in board numbers and the current revision levels thereof together with the availability of the boards in terms of the revision levels thereof. In FIG. 9, the board 10a is displayed as being available, while the board 10n, is displayed as being unavailable in this particular case.

Figure 4:
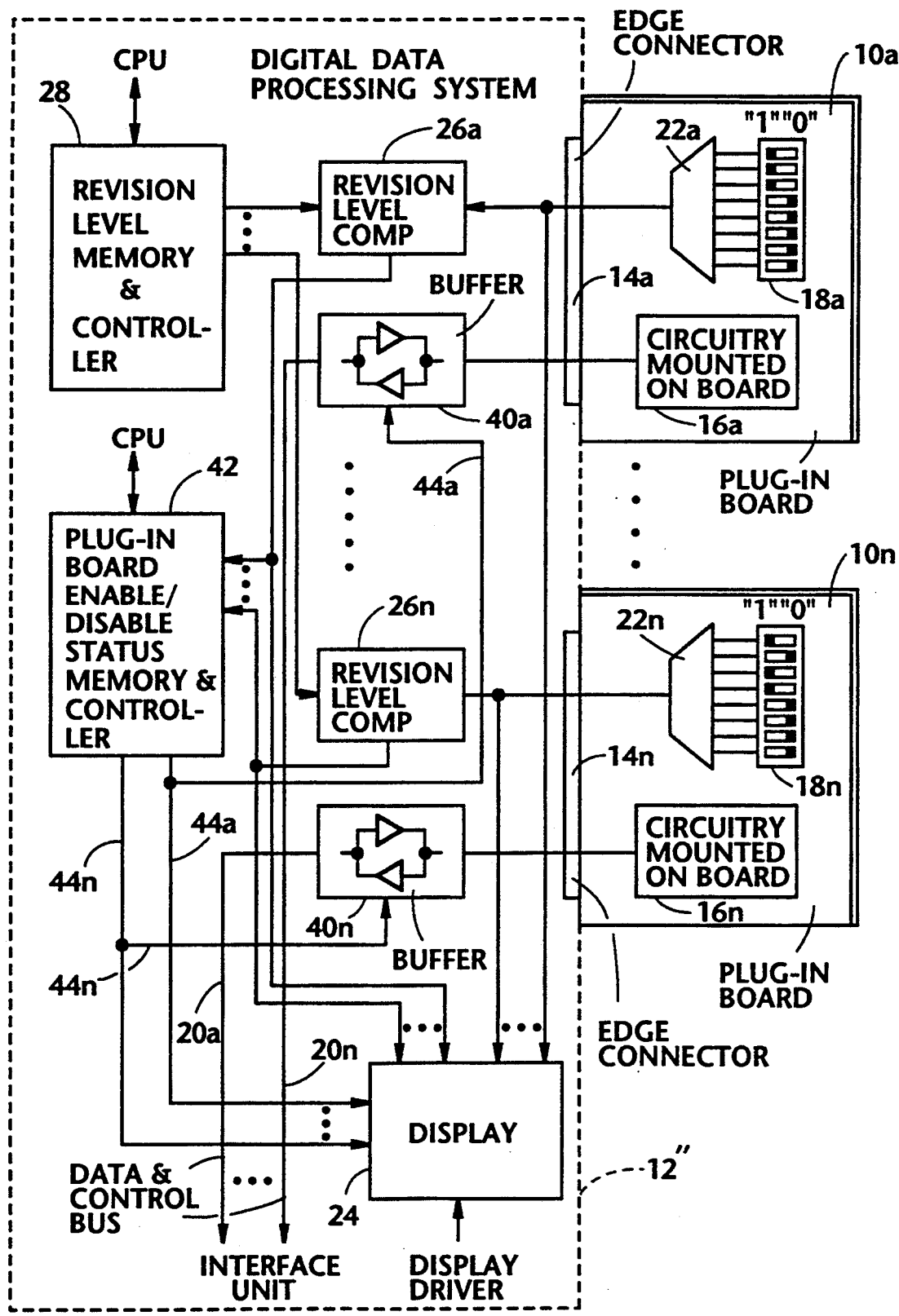
FIG. 4 is a block diagram schematically showing an arrangement of a third embodiment of the present invention.

A third embodiment of the present invention will be discussed with reference to FIGS. 4, 7 and 10.

The arrangement of the third embodiment differs from that of the second one in that a digital data processing system 12″ of the former arrangement further includes a plurality of buffers 40a–40n and a plug-in board enable/disable status memory & controller 42. The remaining portions of the third embodiment are identical with their counterparts and hence will not be described in detail or omitted for brevity.

FIG. 7 is a list showing which board is dispensable if the revision level thereof is not confined within the allowable revision level range shown in FIG. 6. That is, if a dispensability indicating bit assumes a logic "0", the revision level of the corresponding board must be within the allowable range. On the other hand, if the dispensability indicating bit assumes a logic "1", the corresponding board can be dispensable and hence the system 12″ is able to operate without that board. The list shown in FIG. 7 is stored in a memory (not shown) included in the block 42, while the list shown in FIG. 6 is stored in the block 28 as above mentioned.

The buffers 40a–40n are configured in exactly the same manner with one another and respectively arranged between the boards 10a–10n and the interface unit (not shown). Further, the block 42 is coupled, via control lines 44a–44n, to the buffers 40a–40n and the display 24.

The operations of the third embodiment will be discussed. However, the operations thus far described with the first and second embodiments will not be referred to in detail.

When the comparator 26a detects that the revision level of the board 10a is within the allowable range shown in FIG. 6, the comparator 26a applies the comparison result to the block 42 and also to the display 24. In this instance, the revision level "7" of the board 10a is confined within the allowable range "1"–"10" and hence the control section of the block 42 does not check to see if the board 10a is dispensable by referring to the bit indicative of dispensability stored in the block 42. Thus, the control section of the block 42 applies, via a line 44a, the dispensability indicating bit (viz., "0") to the buffer 40a and the display 24. The control section of the block 42 also supplies the display 24 with the signal indicating that "connection" is "YES".

The buffer 40a is configured such that it takes a low impedance state in response to a logic "0" of the dispensability indicating bit and thus allows the board 10a to be connected to the interface unit. On the other hand, if the dispensability indicating bit assumes a logic "1", the buffer 40a is changed to a high impedance state and thus effectively disconnects the board 10a from the interface unit. These operations are applicable to the other buffers 40b–40n although only buffer 40n is shown.

The revision level comparator 26n produces a comparison result which indicates that the revision level of the board 10n is not confined within the allowable range as mentioned above. Accordingly, the control section of the block 42 checks to see if the board 10n is dispensable by referring to the corresponding dispensability indicating bit. Since the bit is "1" and indicates that the board 10n is dispensable (viz., can be omitted), the controller 42 applies a logic 1 to the buffer 40n. Thus, the buffer 40n takes a high impedance state and disconnects the board 10n from the system 12″. Further, the controller 42 supplies the display 24 with a logic 1 and also data indicating that "connection" is "NO". The board 10n is dispensable in this particular case and hence the system 12″ start the operations thereof without use of the board 10n.

Although not shown in FIG. 10, if a given plug-in board has a revision level which is not confined within an allowable range and also if the board is indispensable, then the display 24 exhibits that the board should be changed to a new one having a revision level that matches the allowable range.

It will be understood that the above disclosure is representative of the three possible embodiments of the present invention and that the concept on which the invention is based is not specifically limited thereto.

What is claimed is:

1. An arrangement of ascertaining revision levels of a plurality of plug-in boards which have been inserted into a digital data processing system, comprising:
    a plurality of switch units which are respectively mounted on said plurality of plug-in boards, each of said switch units having a plurality of separate two-position switches for retaining a revision level of a corresponding plug-in board in binary digits, each of said plurality of switch units producing revision level data;
    a display means which is operatively coupled to said plurality of switch units and which receives said revision level data therefrom, said display means exhibiting said revision levels of said plurality of plug-in boards;
    first means for storing a plurality of revision level ranges of said plurality of plug-in boards, each of said revision level ranges indicating a range of revision levels which are available for said digital data processing system;
    a plurality of revision level comparators each of which is arranged between said first means and said plurality of switch units and which is coupled to said display means, each of said revision level comparators receiving a corresponding revision level range from said first means and said revision level from said corresponding plug-in board and checking if said revision level of said corresponding plug-in board is confined within said corresponding revision level range, each of said revision level comparators applying a comparison result to said display means;
    second means for storing a plurality of plug-in board enable/disable data of said plurality of plug-in boards, said second means being coupled to said plurality of revision level comparators, each of said plug-in board enable/disable data indicating if said corresponding plug-in board is dispensable to said data processing system in the event that said corresponding revision level comparator detects that said revision level of said corresponding plug-in board is outside of said corresponding revision level range, said second means generating a plurality of control signals each of which indicates if said corresponding plug-in board is dispensable, said second means being coupled to said display means; and
    a plurality of buffers which are respectively coupled to circuitry mounted on said plurality of plug-in boards and to said second means, each of said plurality of buffers selectively disconnecting said corresponding plug-in board from said digital data processing system in response to said control signal from said second means.

2. An arrangement as claimed in claim 1, wherein each of said plurality of switch units produces a parallel data indicative of said revision level of said corresponding plug-in board, and further comprising a plurality of parallel-to-serial converters each of which receives said parallel data from said corresponding switch unit and converts said parallel data into said corresponding serial data which is applied to said display means.

3. An arrangement of ascertaining revision levels of a plurality of plug-in boards which have been inserted into a digital data processing system, comprising:

a plurality of switch units which are respectively mounted on said plurality of plug-in boards, said switch units having a plurality of separate two-position switches for retaining a revision level of a corresponding plug-in board in binary digits, each of said plurality of switch units producing revision level data;

a display means which is operatively coupled to said plurality of switch units and which receives said revision level data therefrom, said display means exhibiting said revision levels of said plurality of plug-in boards;

first means for storing a plurality of revision level ranges of said plurality of plug-in boards, each of said revision level ranges indicating a range of revision levels which are available for said digital data processing system; and a plurality of revision level comparators each of which is arranged between said first means and said plurality of switch units and which is coupled to said display means, each of said revision level comparators receiving a corresponding revision level range from said first means and said revision level from said corresponding plug-in board and checking if said revision level of said corresponding plug-in board is confined within said corresponding revision level range, each of said revision level comparators applying a comparison result to said display means.

4. An arrangement as claimed in claim 3, wherein each of said plurality of switch units produces parallel data indicative of said revision level of said corresponding plug-in board, and further comprising a plurality of parallel-to-serial converters each of which receives said parallel data from said corresponding switch unit and converts said parallel data into said corresponding serial data which is applied to said display means.

5. An arrangement as claimed in claim 4, wherein a revision level of a plug-in board can be ascertained by visual inspection of switch, positions of said plurality of switch units corresponding to said plug-in board.

* * * * *